(12) United States Patent
Yu

(10) Patent No.: US 6,864,718 B2
(45) Date of Patent: Mar. 8, 2005

(54) CHARGE PUMP LEVEL CONVERTER (CPLC) FOR DUAL VOLTAGE SYSTEM IN VERY LOW POWER APPLICATION

(75) Inventor: Tsung-Hsin Yu, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/371,842

(22) Filed: Feb. 20, 2003

(65) Prior Publication Data

US 2004/0164766 A1 Aug. 26, 2004

(51) Int. Cl.$^7$ .......................................... H03K 19/0175
(52) U.S. Cl. ............................ 326/68; 326/62; 326/81; 326/83; 327/333
(58) Field of Search ................................. 326/62.63, 68, 326/81, 83, 86, 95, 98; 327/51–57, 333

(56) References Cited

U.S. PATENT DOCUMENTS

| | | | | |
|---|---|---|---|---|
| 5,528,173 A | * | 6/1996 | Merritt et al. ................. | 326/80 |
| 6,046,621 A | * | 4/2000 | Crowley ...................... | 327/333 |
| 6,275,070 B1 | * | 8/2001 | Pantelakis et al. ............ | 326/98 |
| 6,288,591 B1 | * | 9/2001 | Riccio ......................... | 327/333 |
| 6,326,839 B2 | * | 12/2001 | Proebsting ................... | 327/589 |
| 6,356,137 B1 | | 3/2002 | Roohparvar et al. ......... | 327/390 |
| 6,414,534 B1 | * | 7/2002 | Wang et al. ................. | 327/333 |
| 6,437,627 B1 | * | 8/2002 | Tran et al. ................... | 327/333 |
| 6,469,542 B2 | * | 10/2002 | Manning ..................... | 326/81 |
| 6,650,168 B1 | * | 11/2003 | Wang et al. ................. | 327/333 |

OTHER PUBLICATIONS

Y. Kanno et al., "Level Converters With High Immunity to Power—Supply Bouncing for High–Speed sub–1–V LSIs," Proc. of Symp. On VLSI Circuit, Jun. 2000, pp. 202–203.

Wen–Tai Wang; Level Shifters for High–Speed 1–V to 3.3–V Interfaces i. a 0.13$\mu$m Cu–interconnection/low–k Cmos Technology, VLSI Teda., System and App., 2001 Proc. of Tech. Papers, 2001, pp. 301–307.

Kam M. Chu et al., "Design Procedures for Differential Cascade Votage Switch Circuits", IEEE Journal of Solid State Circuits, vol. SC–21, No. 6, pp. 1082–1087, Dec. 1986.

Hass et al., : Level Shifting Interfaces for Low Voltage Logic, 9$^{th}$ NABA Symp. On VLSI Design 2000.

Seong–Ook Jung et al., : "Low–Swing Clock Domino Logic Incorporating Dual Supply and Dual Threshold Voltages", no date.

\* cited by examiner

Primary Examiner—Vibol Tan
(74) Attorney, Agent, or Firm—Howard Chen

(57) ABSTRACT

Recent efforts are underway to develop LSI circuits that operate at power supply voltages of 1-V or lower. It is a desire that this low core voltage circuits interface to 3.3-V I/O supply. A charge pump level converter for dual power supply application is proposed using low power and high speed interface to higher I/O supply. This circuit does not consume DC power it is suitable for low power and high speed interface and can be implemented using complementary metal-oxide-semiconductor (CMOS) fabrication processes.

27 Claims, 4 Drawing Sheets

Charge Pump Level Converter

*Differential Cascode Voltage Switch*

CHARGE PUMP LEVEL CONVERTER (CPLC) FOR DUAL VOLTAGE SYSTEM IN VERY LOW POWER APPLICATION

BACKGROUND OF THE INVENTION

1. Field of the Invention

The present invention relates to CMOS (complementary metal-oxide semiconductor) Integrated circuits (IC's) and more specifically to a charge pump level converter (CPLC) for translating low core 1-V to high-speed 3.3-V I/O interface.

2. Description of Related Art

Advances in CMOS technology are driving the operating core voltage of IC's lower. As device dimensions shrink, the voltage of the core logic, scales down proportionally in order to avoid gate-oxide breakdown and hot electron effects. However, the 3.3-V I/O interface remains constant.

Complex integrated circuits operating with supply voltages of 1-V or lower have been demonstrated. In order to incorporate these circuits into existing systems it is necessary to provide interfaces from the low voltage logic to logic devices operating at 3.3-V or higher.

The often seen level converter is DCVS (Differential Cascode Voltage Switch) shown in FIG. 1. The DCVS shown in FIG. 1 becomes too slow or fails, and is unacceptable because the core voltage approaches or is even lower than the threshold voltage Vt of the thick oxide device of the 3.3-V MOSFET.

The low voltage NMOS's (MN11, MN21) are exposed to the I/O high drain voltage that can give electrons sufficient energy that they are injected into the gate oxide and cause permanent damage also known as hot electron effect.

In order to protect the 1.0-V NMOS transistors (MN12, MN22) from high drain voltage stress, a zero-Vt 3.3-V NMOS (MN11, MN21) transistors are used to isolate the output node voltages OUT and $\overline{OUT}$ from transistors MP11 and MP21 as shown in FIG. 2.

This approach is utilizing a large layout area, it is too slow due to the large zero-Vt NMOS device which has large parasitic capacitive loading on the output node, and the fabrication process must provide for native device which is not readily available in conventional CMOS fabrication process.

Related art on the subject of level-up converters circuits has been presented in the literature by:

[1] Y. Kanno, et al, "Level converters with high immunity to power-supply bouncing for high-speed sub-1-V LSIs," in Proc. of Symp. On VLSI Circuit, June 2000, pp. 202–203.
[2] Wen-Tai Wang,: Level shifters for high-speed 1-V to 3.3-V interfaces in a 0.13 um Cu-interconnection/low-k CMOS technology," in VLSI Technology, Systems and Applications, 2001. Proc. Of Technical Papers, 2001 International Symposium, 2001 pp 301–307.,
[3] Kan M. Chu and David I. Pulfrey, "Design Procedures for Differential Cascode Voltage Switch Circuits", IEEE journal of Solid State Circuits Vol SC-21, No 6, pp 1082–1087 pp. 1–82–1087, Dec 1986.
[4] U.S. Pat. No. 6,356,137 Voltage boost circuit with low power supply voltage by Farzan Roohpavar
[5] K. Joe Hass, David F. Cox: Level Shifting Interfaces for Low Voltage Logic, $9^{th}$ NASA Symposium on VLSI Design 2000
[6] Seong-Oak Jung, Ki-Wook Kim Sung-Mo Kang: "Low-Swing Clock Domino Logic Incorporating Dual Supply and Dual Threshold Voltages"

However none of the above related art achieve high speed from 1-V to 3.3-V I/O interface, use only basic CMOS devices and result in smaller layout area.

SUMMARY OF THE INVENTION

It is an object of one embodiment of the present invention to speed up the level conversion from low core 1-V to a 3.3-V I/O interface through the use of a charge pump level converter.

It is another object of the present invention to use basic CMOS devices only, and to minimize layout area.

These objects are achieved by voltage multiplication of the input signal swing using diode connected NMOS transistor with self-nwell PMOS transistor serving as a capacitor thus providing a better charge pump efficiency.

A better understanding of the nature and advantages of the charge pump level converter circuit according to the present invention will be gained with reference to the detailed description below and the accompanying drawings.

DESCRIPTION OF THE PREFERRED EMBODIMENT

Figure 1:
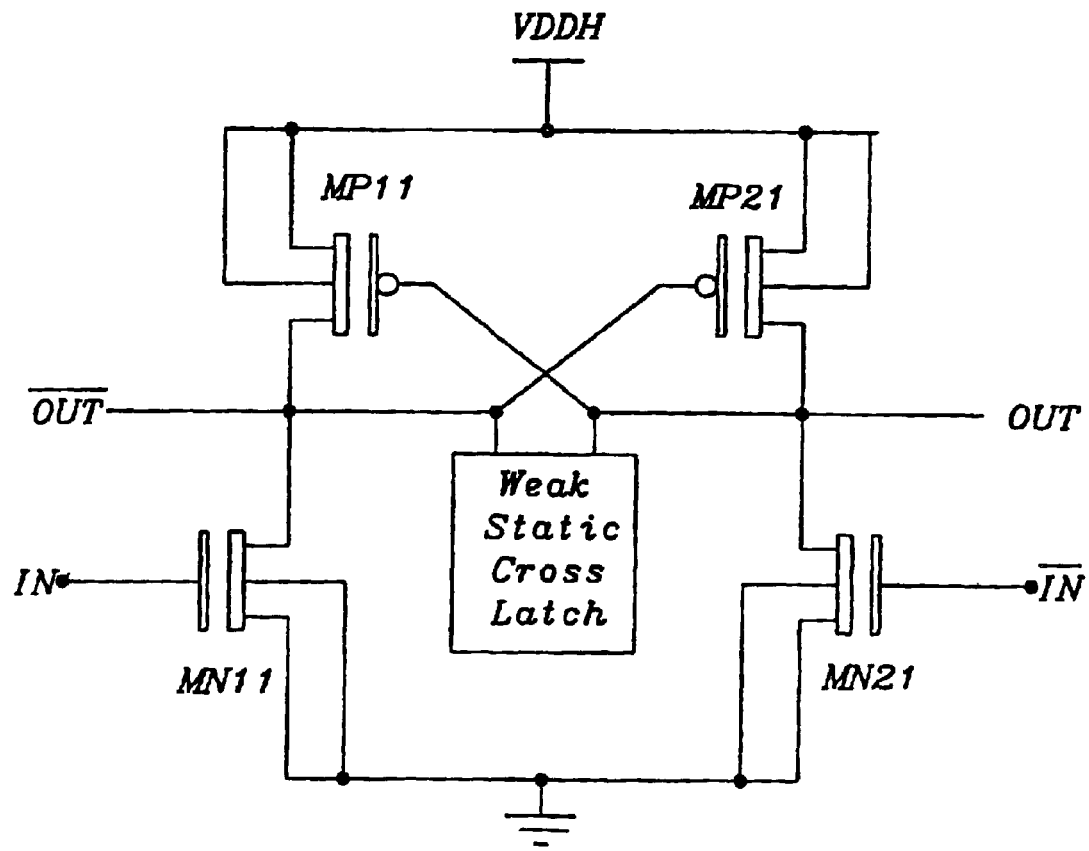
FIG. 1 is a circuit schematic of a prior art Differential Cascode Voltage Switch.
Figure 2:
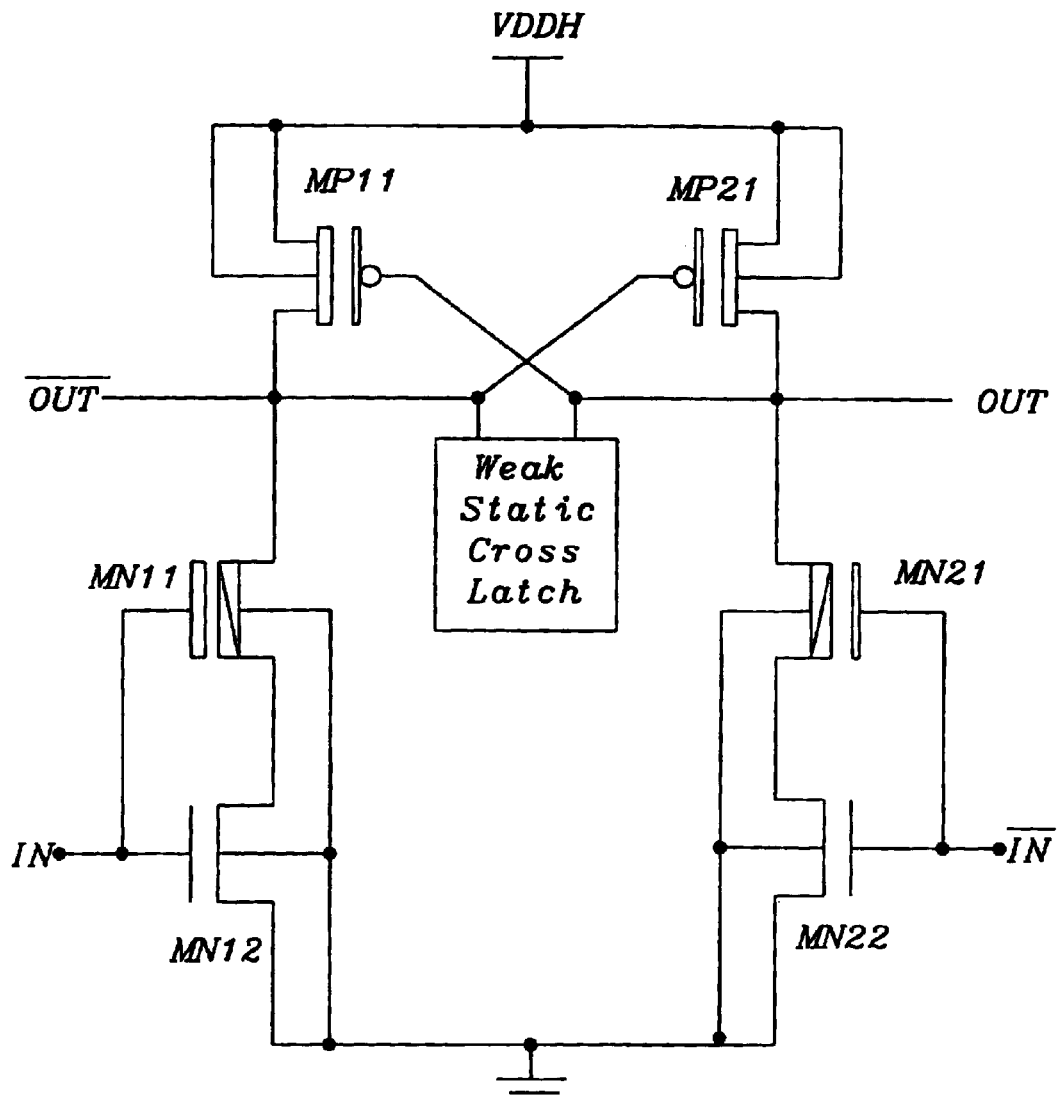
FIG. 2 is a circuit schematic of a prior art Zero-Vt Level Shifter.
Figure 3:
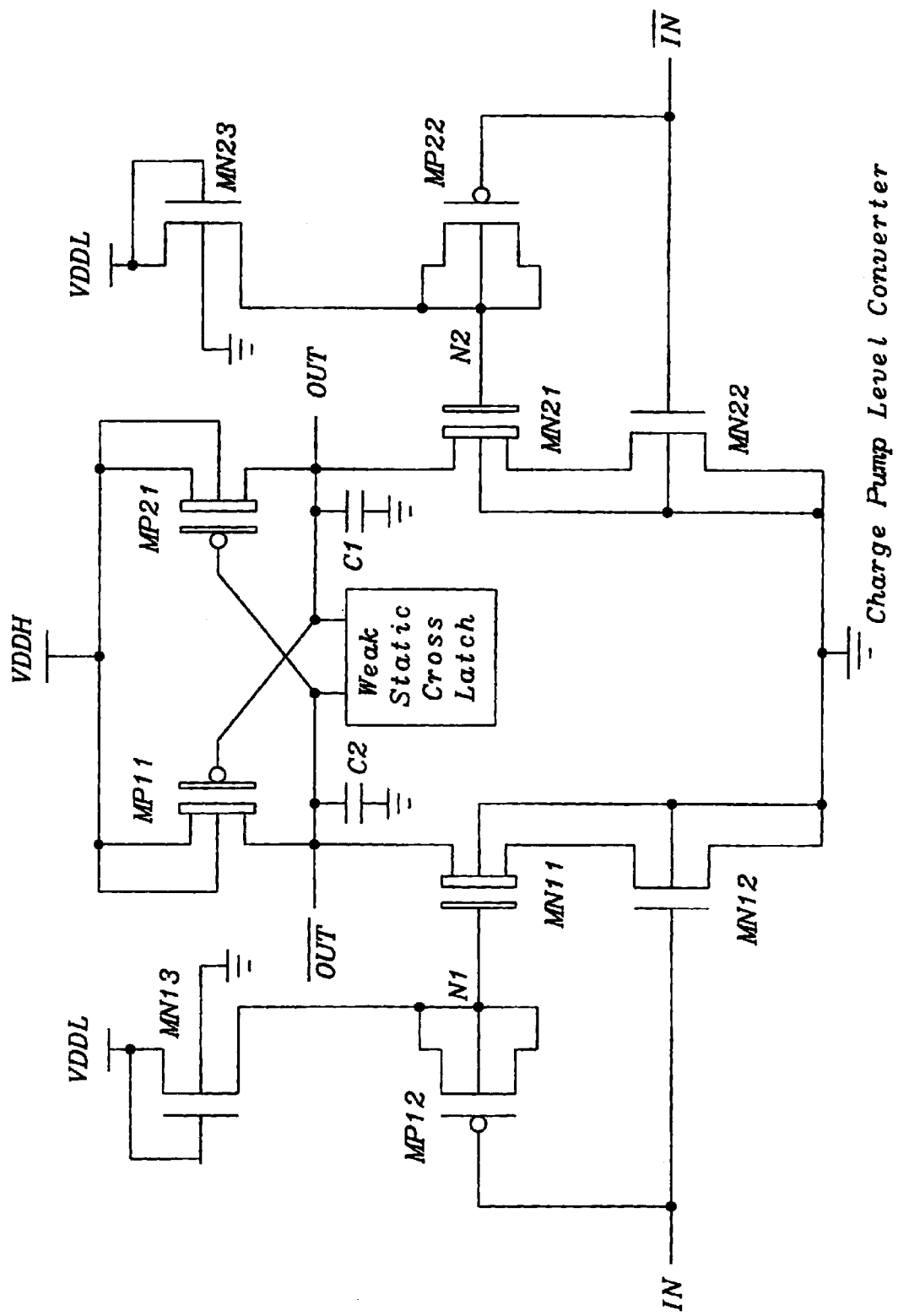
FIG. 3 is an exemplary circuit implementation, for the charge pump level converter according to a specific embodiment of the present invention.
Figure 4:
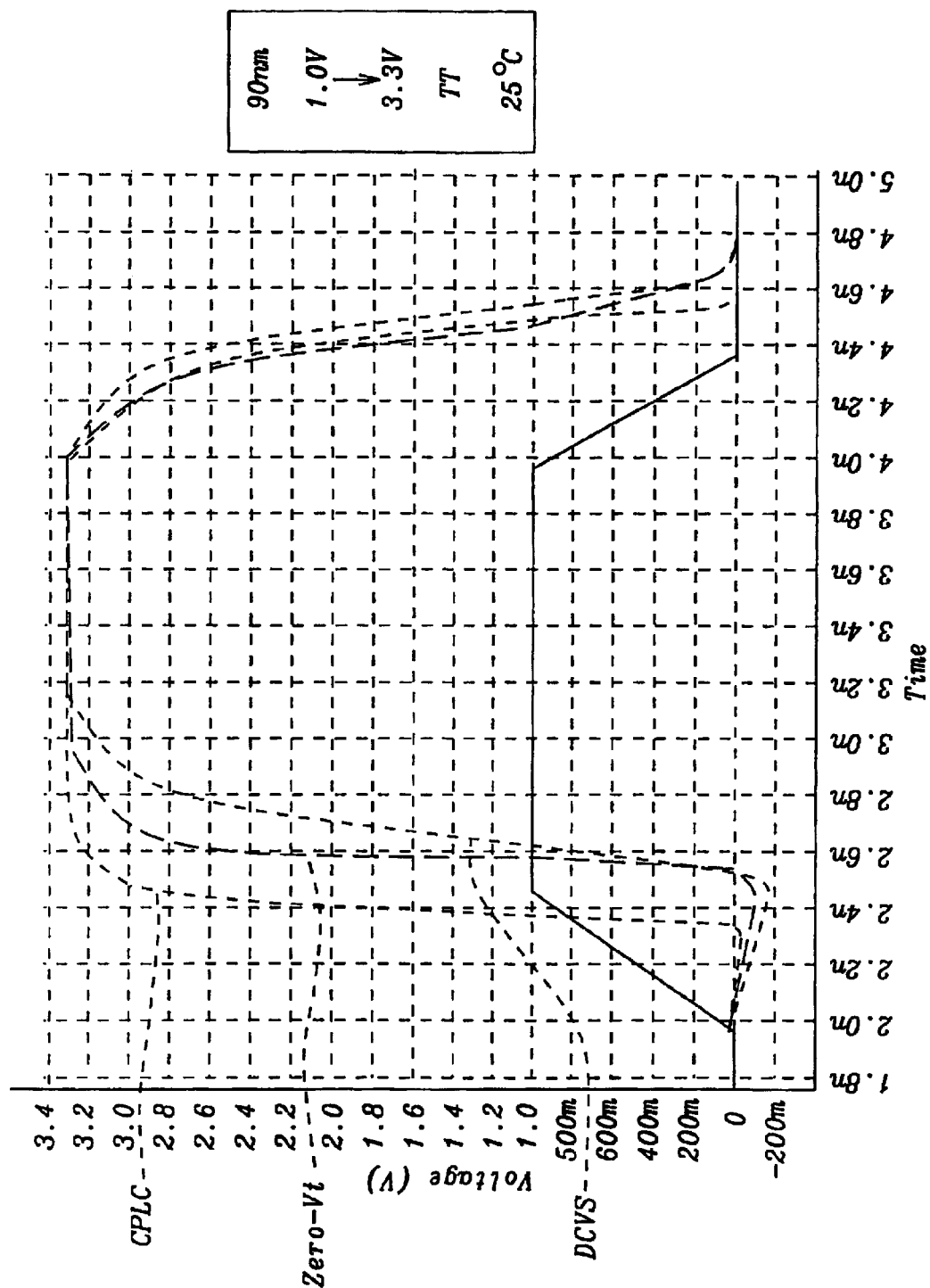
FIG. 4 shows the simulation result and comparison between DCVS, Zero-Vt and CPLC circuit configurations.

FIG. 3 shows the topology for the level shift charge pump level converter (CPLC) according to the present invention.

The CPLC is comprised of two inputs and two outputs. IN is the inphase or true input, and $\overline{IN}$ is the out-of-phase or complement input. The outputs are: OUT which is the inphase or true output, and $\overline{OUT}$ which is the out-of-phase or complement output. The circuit operates between ground and VDDH, which is the higher I/O voltage, and ground and VDDL which is the lower core voltage supply.

The operation of the circuit is as follows:
with the in-phase input IN at logical "0" (ground) and the out-of-phase input $\overline{IN}$ at logical "1" (VDDL), node N1 is pre-charged to (VDDL-Vtn) through the diode connected NMOS device MN13; when the out-of phase input $\overline{IN}$ is at logical "0" and the in-phase input IN is at logical "1", node N2 is pre-charged to (VDDL-Vtn) through the diode connected NMOS device MN23.

Vtn is the threshold of NMOS devices MN13 & MN23. MN13 & MN23 are thin oxide devices.

When the inphase input IN switches from a logic "0" to a logic "1" (0 to VDDL) and the out-of-phase input $\overline{IN}$ switches from a logic "1" to a logic "0" (VDDL to 0), the voltage at node N1 is boosted to (VDDL-Vtn)+VDDL= (2VDDL-Vtn) through the coupling that takes place via self-nwell PMOS transistor MP12 that acts as a capacitor.

The PMOS self-nwell MP12 does not have a leakage path so it is more efficient than an NMOS capacitor which normally has a leakage path to substrate and gets worse performance. The capacitor formed by PMOS self-nwell configuration is as close as possible to an ideal case.

By separating the N well of MP12 & MP22 from other PMOS's (MP11 & MP21) makes charge pumping more efficient.

The coupling capacitance provided by the use of the self-nwell PMOS configuration provides a larger gate drive (Vgs) in order to turn on NMOS device MN11. The NMOS MN13 and the PMOS capacitor MP12 may be referred to as a pre-charging module. Similarly, MN23 and MP22 is another pre-charging module. In addition, other circuit elements of the CPLC can be referred to as a differential cascode voltage switch module.

MN11 & MN21 are thick oxide devices and have larger Vt.

As a result of IN transitioning from logic "0" to "1" and $\overline{\text{IN}}$ from "1" to "0" the out-of-phase output $\overline{\text{OUT}}$ discharges to logic "0", MN22 turns off and MP21 turns on driving in-phase node OUT to logic "1" (VDDH). Turning off MN21 when MP21 pulls up isolates the parasitic capacitance C1 from node OUT and thus results in increased switching speed.

When $\overline{\text{IN}}$ transitions from "0" to "1" and IN from "1" to "0" the in-phase output OUT discharges to logic "0", MN12 turns off and MP11 turns on driving out-of-phase node $\overline{\text{OUT}}$ to logic "1" (VDDH). Turning off MN11 when MP11 pulls up isolates the parasitic capacitance C2 from node $\overline{\text{OUT}}$.

Thick oxide MN11 & MN21 each form a cascode structure with MN12 or MN22 in order to bias and protect the thin oxide NMOS MN12 & MN22 against VDDH overstress.

Lower core voltage at IN could be converted to higher I/O voltage at OUT even if core voltage VDDL is lower than the threshold voltage (Vt) of thick oxide device.

In summary the present invention of CPLC speeds up the conversion speed from very low core voltage to higher I/O voltage. It uses basic complementary devices only, and occupies smaller layout area.

While the invention has been particularly shown and described with reference to the preferred embodiment thereof, it will be understood by those skilled in the art that various changes in form and details may be made without departing from the spirit and scope of the invention.

What is claimed is:

1. A complementary metal oxide-semiconductor (CMOS) charge pump level converter circuit comprising:
   a differential cascode voltage switch module operating with a high supply voltage having a low voltage first input and a complementary low voltage second input coupled to a first and a second cascode structures respectively for generating a first output and a complementary second output;
   a first pre-charge module operating with a low supply voltage coupled between the first input and a gate of a first transistor of the first cascode structure; and
   a second pre-charge module operating with the low supply voltage coupled between the second input and a gate of a second transistor of the second cascode structure,
   wherein the first input is further coupled to a gate of a third transistor which is in series with the first transistor in the first cascode structure, and the second input is further coupled to a gate of a fourth transistor which is in series with the second transistor in the second cascode structure, and
   wherein the first and second pre-charge modules drive the first and second transistors in response to a change of the first and second inputs while protecting the third and fourth transistors from high voltage stress.

2. The charge pump level converter circuit of claim 1, wherein the first pre-charge module further includes a diode connected NMOS transistor coupled between the low supply voltage and the gate of first transistor.

3. The charge pump level converter circuit of claim 2, wherein the first pre-charge module further includes a capacitance device coupled between the first input and the gate of the first transistor.

4. The charge pump level converter circuit of claim 3, wherein the capacitance device is a P-channel transistor whose drain and source are tied to the P-channel transistor's body terminal to be coupled to the gate of the first transistor, and whose gate is coupled to the first input.

5. The charge pump level converter circuit of claim 1, wherein the second pre-charge module further includes is a diode connected NMOS transistor coupled between the low supply voltage and the gate of second transistor.

6. The charge pump level converter circuit of claim 5, wherein the second pre-charge module further includes a capacitance device coupled between the second input and the gate of the second transistor.

7. The charge pump level converter circuit of claim 6, wherein the capacitance device is a P-channel transistor whose drain and source are tied to the P-channel transistor's body terminal to be coupled to the gate of the second transistor, and whose gate is coupled to the second input.

8. The charge pump level converter circuit of claim 1, wherein the first or second pre-charge module boosts a voltage level of the gate of the first or second transistors to a predetermined value higher than the low supply voltage when the corresponding first or second input changes from a logic "0" to "1".

9. The charge pump level converter circuit of claim 8, wherein the boosted voltage level is at least two times of the low supply voltage minus a predetermined thin oxide transistor threshold voltage.

10. The charge pump level converter of claim 1 further comprising two P-channel pull-up transistors cross-coupled between the high supply voltage and the first and second outputs.

11. The charge pump level converter of claim 10 wherein the pull-up transistors are thick oxide transistors.

12. The charge pump level converter of claim 1 wherein the first and second transistors are thick oxide transistors.

13. The charge pump level converter of claim 1 wherein the third and fourth transistors are thin oxide transistors.

14. A complementary metal oxide-semiconductor (CMOS) charge pump level converter circuit comprising:
   a differential cascode voltage switch module operating with a high supply voltage having a low voltage first input and a complementary low voltage second input coupled to a first and a second cascode structures respectively for generating a first output and a complementary high voltage second output;
   a first pre-charge module operating with a low supply voltage and having a first diode connected NMOS transistor coupled between the low supply voltage and a gate of a first transistor of the first cascode structure and a first transistor based capacitance device coupled between the first input and the gate of the first transistor; and
   a second pre-charge module operating with a low supply voltage and having a second diode connected NMOS transistor coupled between the low supply voltage and a gate of a second transistor of a second cascode structure and a second transistor based capacitance device coupled between the second input and the gate of the second transistor,
   wherein the first input is further coupled to a gate of a third transistor which is in series with the first transistor in the first cascode structure, and the second input is further coupled to a gate of a fourth transistor which is in series with the second transistor in the second cascode structure, wherein the first and second pre-charge modules drive the first and second transistors in response to a change of the first and second inputs while protecting the third and fourth transistors from high voltage stress, and wherein the first and second transistors are thick oxide transistors and the third and fourth transistors are thin oxide transistors.

15. The charge pump level converter circuit of claim 14, wherein the first and second capacitance devices are P-channel transistors whose drains and sources are tied to their body terminals to be coupled to the gates of the first and second transistor respectively, and whose gates are coupled to the first and second inputs respectively.

16. The charge pump level converter circuit of claim 14, wherein the first or second pre-charge module boosts a voltage level of the gate of the first or second transistor to a predetermined value sufficient to drive the first or second transistor at a predetermined speed when the corresponding first or second input changes from a logic "0" to "1".

17. The charge pump level converter circuit of claim 16, wherein the boosted voltage level is at least two times of the low supply voltage minus a predetermined threshold voltage of the first or second diode connected NMOS transistor respectively.

18. The charge pump level converter of claim 14 further comprising two P-channel pull-up transistors cross-coupled between the high supply voltage and the first and second outputs.

19. The charge pump level converter of claim 18 wherein the pull-up transistors are thick oxide transistors.

20. The charge pump level converter of claim 14 wherein the low supply voltage is lower than a predetermined threshold voltage of the thick oxide devices.

21. A method for converting one or more low voltage inputs to one or more high voltage outputs in an integrated circuit, the method comprising:

receiving a low voltage first input and a complementary low voltage second input by a first and a second cascode structures of a differential cascode voltage switch module operating with a high supply voltage;

boosting a voltage level of the first or second input to a predetermined value for driving a gate of a first or second thick oxide transistor of the first or second cascode structure with a predetermined speed when the corresponding first or second input changes from a logic "0" to "1"; and directly driving a thin oxide third or fourth transistor coupled in series with the first or second transistor by the first or second input respectively, wherein the first and third transistors in the first cascode structure help to generate a first output and the second and fourth transistors in the second cascode structure help to generate a complementary second output.

22. The method of claim 21 wherein the boosting further includes pre-charging the gate of the first or second transistor to a value equivalent to the low supply voltage minus a predetermined transistor threshold voltage when the first or second input associated thereto is a logic "0".

23. The method of claim 22 wherein the pre-charging further includes using a diode connected NMOS transistor coupled between the low supply voltage and the gate of the first or second transistor respectively and a transistor based capacitance device coupled between the first or second input and the gate of the first or second transistor respectively.

24. The method of claim 23 wherein the transistor based capacitance device is a P-channel transistor whose drain and source is tied to its body terminal.

25. The method of claim 23 wherein the boosted voltage level is at least two times of the low supply voltage minus a predetermined threshold voltage of the diode connected NMOS transistor.

26. The method of claim 21 further comprising pulling up the first or second output by a P-channel pull-up transistor.

27. The method of claim 26 wherein the pull-up transistor is a thick oxide transistor.

* * * * *